US012622126B2

(12) United States Patent
Matsushita

(10) Patent No.: US 12,622,126 B2
(45) Date of Patent: May 5, 2026

(54) SOLAR CELL AND METHOD FOR PRODUCING SOLAR CELL

(71) Applicant: Panasonic Holdings Corporation, Osaka (JP)

(72) Inventor: Akio Matsushita, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 18/491,762

(22) Filed: Oct. 21, 2023

(65) Prior Publication Data

US 2024/0049486 A1      Feb. 8, 2024

Related U.S. Application Data

(63) Continuation of application No. PCT/JP2022/010969, filed on Mar. 11, 2022.

(30) Foreign Application Priority Data

May 21, 2021      (JP) ................................. 2021-086526

(51) Int. Cl.
| | |
|---|---|
| *H10K 30/40* | (2023.01) |
| *H10K 30/57* | (2023.01) |
| *H10K 30/80* | (2023.01) |
| *H10K 30/85* | (2023.01) |
| *H10K 71/13* | (2023.01) |
| *H10K 71/15* | (2023.01) |
| *H10K 85/50* | (2023.01) |

(52) U.S. Cl.
CPC ............. *H10K 30/40* (2023.02); *H10K 30/57* (2023.02); *H10K 30/80* (2023.02); *H10K 30/85* (2023.02); *H10K 71/13* (2023.02); *H10K 71/15* (2023.02); *H10K 85/50* (2023.02)

(58) Field of Classification Search
None
See application file for complete search history.

(56) References Cited

U.S. PATENT DOCUMENTS

| | | | |
|---|---|---|---|
| 2016/0149145 A1* | 5/2016 | Mhaisalkar | H10K 85/371 |
| | | | 438/82 |
| 2021/0091323 A1 | 3/2021 | Yokoyama et al. | |
| 2022/0158104 A1* | 5/2022 | Kinge | H10K 30/40 |

FOREIGN PATENT DOCUMENTS

| | | |
|---|---|---|
| WO | 2017/009688 | 1/2017 |

OTHER PUBLICATIONS

Wei et al., Adv. Mater., 2020, 21 1907058. (Year: 2020).*
Kamarudin et al., J. Phys. Chem. Lett., 2019, 10 5277-5283. (Year: 2019).*

(Continued)

*Primary Examiner* — Eli S Mekhlin
(74) *Attorney, Agent, or Firm* — Greenblum & Bernstein, P.L.C.

(57) ABSTRACT

A solar cell according to the present disclosure includes a first electrode, a photoelectric conversion layer, and a second electrode in this order. The photoelectric conversion layer comprises a perovskite compound comprising a first metal element and a second metal element, a first compound comprising the first metal element and a first amine material having two or more carbon atoms, and a second compound comprising the second metal element and a second amine material having two or more carbon atoms.

9 Claims, 3 Drawing Sheets

100

(56)           References Cited

OTHER PUBLICATIONS

International Search Report of PCT application No. PCT/JP2022/010969 dated May 10, 2022.

Julian Burschka et al., "Sequential deposition as a route to high-performance perovskite-sensitized solar cells", Nature, vol. 499, Jul. 10, 2013, pp. 316-319.

Yuhei Ogomi et al., "CH3NH3SnxPb(1-x)I3 Perovskite Solar Cells Covering up to 1060 nm", The Journal of Physical Chemistry Letters, 2014, vol. 5, Mar. 3, 2014, pp. 1004-1011.

The EPC Office Action dated Feb. 7, 2025 for the related European Patent Application No. 22804331.1.

Alharbi Essa A. et al: "Atomic-level passivation mechanism of ammonium salts enabling highly efficient perovskite solar cells", Nature Communications, vol. 10, No. 1, Jul. 8, 2019 (Jul. 8, 2019), XP093244522.

Lu Jianfeng et al: "Diammonium and Monoammonium Mixed-Organic-Cation Perovskites for High Performance Solar Cells with Improved Stability", Advanced Energy Materials, vol. 7, No. 18, May 23, 2017 (May 23, 2017), p. 1700444, XP055867119.

* cited by examiner

100

200

SOLAR CELL AND METHOD FOR PRODUCING SOLAR CELL

BACKGROUND

1. Technical Field

The present disclosure relates to a solar cell and a method for producing a solar cell.

2. Description of the Related Art

In recent years, solar cells in which a halide having a perovskite-type crystal structure or a structure similar thereto (hereafter referred to as "perovskite compound") is used as a photoelectric conversion material (hereafter referred to as "perovskite solar cell") have been researched and developed.

Julian Burschka et al., "Sequential deposition as a route to high-performance perovskite-sensitized solar cells", Nature, vol. 499, pp. 316-319, 2013 discloses a perovskite solar cell in which a perovskite compound denoted by $CH_3NH_3PbI_3$ (hereafter referred to as "$MAPbI_3$") is used as a photoelectric conversion material, $TiO_2$ is used as an electron transport material, and Spiro-OMeTAD is used as a hole transport material. Yuhei Ogomi et al., "CH3NH3SnxPb(1-x)I3 Perovskite Solar Cells Covering up to 1060 nm", The Journal of Physical Chemistry Letters, vol 5, pp. 1004-1011, 2014 discloses a solar cell in which the band gap of a photoelectric conversion material of less than or equal to 1.3 eV is realized by using a complex perovskite material including two divalent cations of tin and lead.

SUMMARY

One non-limiting and exemplary embodiment provides a solar cell having a configuration suitable for improving the photoelectric conversion efficiency with respect to a perovskite solar cell using a complex perovskite material.

In one general aspect, the techniques disclosed here feature a solar cell including a first electrode, a photoelectric conversion layer, and a second electrode in this order, wherein the photoelectric conversion layer contains a perovskite compound containing a first metal element and a second metal element, a first compound containing the first metal element and a first amine material having two or more carbon atoms, and a second compound containing the second metal element and a second amine material having two or more carbon atoms.

The present disclosure provides a solar cell having a configuration suitable for improving the photoelectric conversion efficiency with respect to a perovskite solar cell using a complex perovskite material.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Definition of Term

Figure 1:
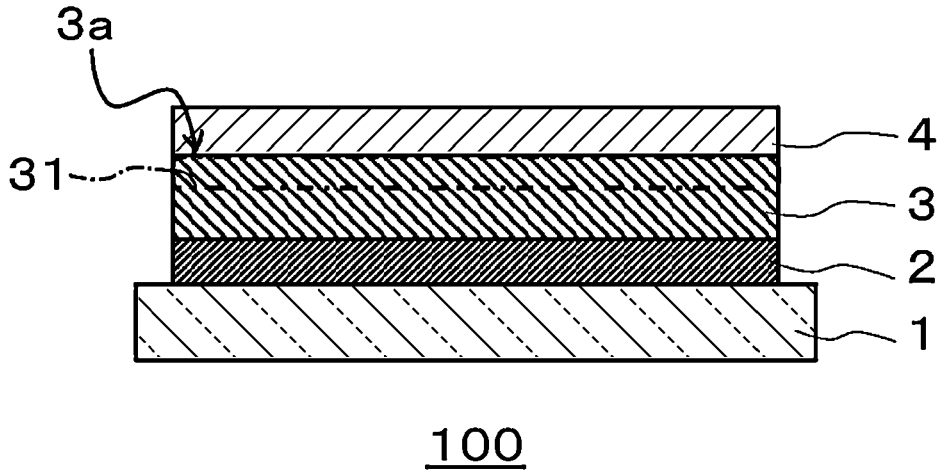
FIG. 1 is a sectional view illustrating a solar cell 100 according to an embodiment of the present disclosure.

A term "perovskite compound" used in the present specification means a perovskite crystal structure denoted by a chemical formula $ABX_3$ or a structure having a crystal similar to the perovskite crystal. Herein, A represents a monovalent cation, B represents a divalent cation, and X represents a halogen anion.

A term "complex perovskite compound" used in the present specification means a perovskite compound denoted by the above-described chemical formula $ABX_3$ where B includes two or more types of divalent cations. As an example, "tin-lead complex perovskite compound" means a perovskite compound including both tin and lead as divalent cations.

Underlying Knowledge Forming Basis of the Present Disclosure

A tandem solar cell is a solar cell in which a plurality of photoelectric conversion materials having band gaps that differ from each other are stacked. The tandem solar cell can absorb the light in a wider band compared with a solar cell including a single photoelectric conversion material, and a solar cell having a high conversion efficiency can be realized.

When a perovskite compound is used in the tandem solar cell, in a common structure, a solar cell including a perovskite compound having a wide band gap (having a band gap of, for example, greater than 1.7 eV) (that is, "top cell") and a solar cell including a perovskite compound having a narrow band gap (having a band gap of, for example, less than 1.3 eV) (that is, bottom cell) are stacked.

A perovskite compound including a plurality of divalent cations at the B site is a known perovskite compound having a narrow band gap. Yuhei Ogomi et al., "CH3NH3SnxPb(1-x)I3 Perovskite Solar Cells Covering up to 1060 nm", The Journal of Physical Chemistry Letters, vol 5, pp. 1004-1011, 2014 discloses a solar cell in which the band gap of a photoelectric conversion material of less than 1.3 eV is realized by using two divalent cations of tin and lead in combination.

However, when a plurality of divalent cations are used in combination, it is difficult to obtain a high conversion efficiency compared with when only one divalent cation is used. The reason for this is that, when a plurality of divalent cations are used, the materials constituting the B site need the respective mechanisms for suppressing recombination and deterioration in the material from occurring. In the example described in Yuhei Ogomi et al., "CH3NH3SnxPb(1-x)I3 Perovskite Solar Cells Covering up to 1060 nm", The Journal of Physical Chemistry Letters, vol 5, pp. 1004-1011, 2014, the conversion efficiency of a cell in which tin and lead are used in combination is less than or equal to half the conversion efficiency of a cell in which only lead is used.

In consideration of these findings, the present inventors performed intensive research. As a result, it was found that the photoelectric conversion efficiency of a solar cell in which a complex perovskite compound is used as the photoelectric conversion material can be improved by compounds of the individual cations constituting the B site and the amine materials having two or more carbon atoms being individually formed and contained in the photoelectric conversion layer.

EMBODIMENTS ACCORDING TO THE PRESENT DISCLOSURE

A solar cell according to an embodiment of the present disclosure includes a first electrode, a photoelectric conversion layer, and a second electrode in this order. The photoelectric conversion layer contains a perovskite compound containing a first metal element and a second metal element, a first compound, and a second compound. The first compound contains the first metal element and a first amine material having two or more carbon atoms. The second compound contains the second metal element and a second amine material having two or more carbon atoms.

According to the above-described configuration, in the photoelectric conversion layer, factors of a decrease in the photoelectric conversion efficiency, such as recombination and deterioration in the material, can be suppressed from occurring with respect to each of the first metal element and the second metal element in the perovskite compound. As a result, regarding the solar cell according to the present embodiment, the photoelectric conversion efficiency of the solar cell including the complex perovskite compound as the photoelectric conversion material can be improved.

FIG. 1 is a sectional view illustrating a solar cell 100 according to a first embodiment. The solar cell 100 is an example (first configuration example) of the solar cell according to the present disclosure.

The solar cell 100 includes a substrate 1, a first electrode 2, a photoelectric conversion layer 3, and a second electrode 4 in this order.

The photoelectric conversion layer 3 contains a complex perovskite compound. The complex perovskite compound contains, for example, cations of both the first metal element and the second metal element at the B site in a chemical formula $ABX_3$.

The photoelectric conversion layer 3 further contains the first compound containing the first metal element and the first amine material having two or more carbon atoms and the compound containing the second metal element and the second amine material having two or more carbon atoms. In this regard, the first amine material and the second amine material may be amine materials having compositions that differ from each other or may be amine materials having the same composition.

In the solar cell according to the present embodiment, the photoelectric conversion layer may have, on a face opposite the second electrode, a surface region containing the first compound and the second compound. For example, in the solar cell 100 illustrated in FIG. 1, for example, the first compound and the second compound may be present in a surface-3a-side region, the surface 3a of the photoelectric conversion layer 3 being opposite the second electrode 4. Such a surface region 31 can also be assumed to be an interface layer between the photoelectric conversion layer 3 and a layer adjacent thereto (the second electrode 4 in the solar cell in FIG. 1). That is, in other words, the solar cell according to the present embodiment may include an interface layer containing the first compound and the second compound between the face of the photoelectric conversion layer opposite the second electrode and the surface of the layer adjacent to the photoelectric conversion layer.

Between the layers constituting the solar cell 100, another layer may be further disposed to suppress interface recombination between the layers or to bond the layers.

For example, the solar cell according to the present embodiment may further include a hole transport layer. The hole transport layer is disposed, for example, between the first electrode and the photoelectric conversion layer.

For example, the solar cell according to the present embodiment may further include an electron transport layer. The electron transport layer is disposed, for example, between the second electrode and the photoelectric conversion layer.

Figure 2:
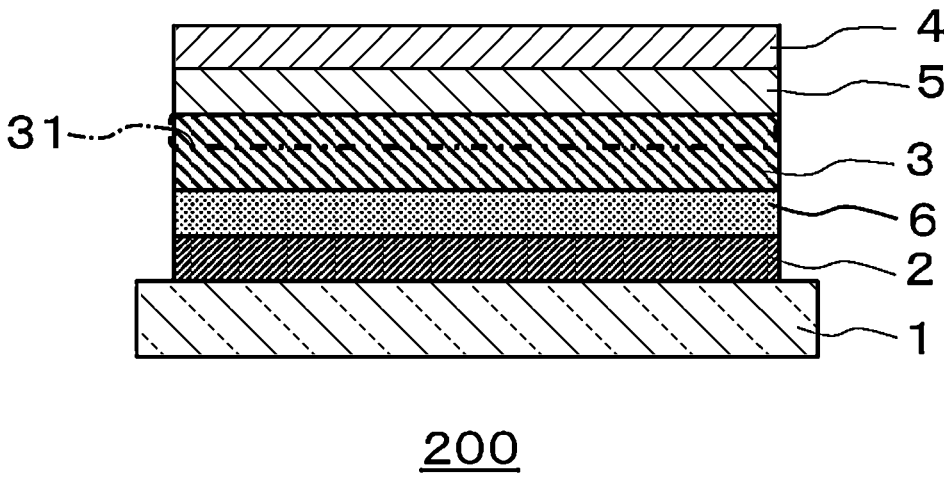
FIG. 2 is a sectional view illustrating a solar cell 200 according to an embodiment of the present disclosure.

FIG. 2 is a sectional view illustrating a solar cell 200 according to the first embodiment of the present disclosure. The solar cell 200 is a modified example (second configuration example) of the solar cell according to the present disclosure.

The solar cell 200 has a configuration in which a hole transport layer and an electron transport layer are added to the solar cell 100. Specifically, the solar cell 200 includes a substrate 1, a first electrode 2, a hole transport layer 6, a photoelectric conversion layer 3, an electron transport layer 5, and a second electrode 4 in this order.

According to the above-described configuration, in addition to the effect akin to that of the solar cell 100, that is, the effect of enabling the photoelectric conversion efficiency to be improved, being realized, further, the hole and the electron can be efficiently exploited. Consequently, the solar cell 200 can further improve the photoelectric conversion efficiency.

Each component of the solar cell according to the present disclosure will be described below in detail.

Substrate 1

The substrate 1 plays a role in supporting each layer of the solar cell. The substrate 1 can be formed of a transparent material. A glass substrate or a plastic substrate can be used as such a material. The plastic substrate may be a plastic film.

When the first electrode 2 has sufficient strength, since the first electrode 2 can support each layer, the substrate 1 is not limited to be disposed.

First Electrode 2

The first electrode 2 has electrical conductivity. The first electrode 2 has, for example, a light-transmitting property. The first electrode 2 passes the light in the visible region to the near-infrared region. The first electrode 2 may be formed of, for example, a metal oxide that is transparent and that has electrical conductivity. An example of such a metal oxide is (i) an indium-tin complex oxide (ii) a tin oxide doped with antimony (iii) a tin oxide doped with fluorine (iv) a zinc oxide doped with at least one selected from the group consisting of boron, aluminum, gallium, and indium, or (v) a complex of these.

The first electrode 2 may be formed by using an opaque material and by being provided with a pattern through which the light passes. An example of the pattern through which the light passes is a linear pattern (for example, a stripe-like pattern), a wavy-line-like pattern, a grid-like pattern (for example, a mesh-like pattern), or a punching-metal-like pattern in which a plurality of fine through holes are regularly or irregularly arranged. The first electrode 2 being provided with these patterns enables the light to pass through portions with no electrode material. An example of the opaque material is platinum, gold, silver, copper, aluminum, rhodium, indium, titanium, iron, nickel, tin, zinc, or an alloy containing any one of these. A carbon material having electrical conductivity may be used as the opaque material.

When the solar cell does not include the hole transport layer 6, the first electrode 2 has a blocking property against electrons from the photoelectric conversion layer 3. In such an instance, the first electrode 2 does not come into ohmic contact with the photoelectric conversion layer 3. Further, the blocking property against electrons from the photoelectric conversion layer 3 denotes a property of allowing only holes generated in the photoelectric conversion layer 3 to pass through and not allowing electrons to pass through. The Fermi energy of the material having such a property is lower than the energy level of the conduction band lower end of the photoelectric conversion layer 3. The Fermi energy of the material having such a property may be lower than the Fermi energy of the photoelectric conversion layer 3. An example of the material having a blocking property against electrons is platinum, gold, or a carbon material such as graphene.

When the solar cell includes the hole transport layer 6 between the first electrode 2 and the photoelectric conversion layer 3, the first electrode 2 is not limited to having a blocking property against electrons from the photoelectric conversion layer 3. In such an instance, the first electrode 2 may be formed of a material capable of coming into ohmic contact with the photoelectric conversion layer 3. In such an instance, the first electrode 2 is not limited to being in ohmic contact with the photoelectric conversion layer 3.

The light transmittance of the first electrode 2 may be greater than or equal to 50% or may be greater than or equal to 80%. The wavelength of the light that passes through the first electrode 2 is in accordance with the absorption wavelength of the photoelectric conversion layer 3.

The first electrode 2 may have a thickness of, for example, greater than or equal to 1 nm and less than or equal to 1,000 nm.

When the first electrode 2 is disposed at the position farthest from the light-incident side, the first electrode 2 is not limited to having a light-transmitting property, and an opaque electrode material can also be used without being processed.

Second Electrode 4

The second electrode 4 is a layer having a function akin to that of the first electrode 2, and a material and a configuration akin to that of the first electrode 2 can be adopted. In this regard, when the second electrode 4 is disposed at the position farthest from the light-incident side, the second electrode 4 is not limited to having a light-transmitting property, and an opaque electrode material can also be used without being processed.

When the solar cell does not include the electron transport layer 5, the second electrode 4 has a blocking property against holes from the photoelectric conversion layer 3. In such an instance, the second electrode 4 does not come into ohmic contact with the photoelectric conversion layer 3. Further, the blocking property against holes from the photoelectric conversion layer 3 denotes a property of allowing only electrons generated in the photoelectric conversion layer 3 to pass through and not allowing holes to pass through. The Fermi energy of the material having such a property is higher than the energy level of the conduction band higher end of the photoelectric conversion layer 3. The Fermi energy of the material having such a property may be higher than the Fermi energy of the photoelectric conversion layer 3. Examples of specific material include aluminum. In this regard, aluminum does not have a light-transmitting property. Therefore, when a light-transmitting electrode is formed by using aluminum, an electrode having, for example, a pattern shape described with respect to the first electrode 2 is adopted.

Photoelectric Conversion Layer 3

As described above, the photoelectric conversion layer 3 contains a complex perovskite compound. The complex perovskite compound may be denoted by a composition formula $ABX_3$.

Herein, A represents a monovalent cation. An example of the monovalent cation is an alkali metal cation or an organic cation. X represents a monovalent anion. An example of the monovalent anion is a halogen anion.

Each of the A site and the X site may be occupied by a plurality of types of ions.

B represents two or more types of divalent cations. Examples of the divalent cation include divalent cations of transition metal elements and elements of group XIII to group XV. That is, B contains, for example, cations of a first metal element and a second metal element. The first metal element and the second metal element are, for example, elements selected from the group consisting of transition metal elements and elements of group XIII to group XV. The first metal element is, for example, lead. The second metal element is, for example, tin.

The photoelectric conversion layer 3 contains a first compound containing the first metal element and a first amine material having two or more carbon atoms. In addition, the photoelectric conversion layer 3 contains a second compound containing the second metal element and a second amine material having two or more carbon atoms.

There is no particular limitation regarding the first compound provided that the first compound is a compound containing the first metal element and the first amine material. For example, the first compound may have a structure in which an organic cation of a perovskite compound constituting the photoelectric conversion layer 3 is replaced with the first amine material, and, further, the divalent cation may be composed of only a cation of the first metal element. There is no particular limitation regarding the second compound provided that the second compound is a compound containing the second metal element and the second amine material. For example, the second compound may have a structure in which an organic cation of a perovskite compound constituting the photoelectric conversion layer 3 is replaced with the second amine material, and, further, the divalent cation may be composed of only a cation of the second metal element.

There is no particular limitation regarding the first amine material and the second amine material provided that the first amine material and the second amine material are amine compounds having two or more carbon atoms and containing a primary amino group, a secondary amino group, or a tertiary amino group. An example of the first amine material or the second amine material having two or more carbon atoms is an amine compound in which an ethyl group, a long-chain alkyl group, a phenyl group, a benzyl group, or a phenethyl group is bonded to a nitrogen atom. An example of the amine compound is n-butylamine, phenethylamine, or ethylenediamine. The first amine material and the second amine material may be at least one selected from the group consisting of n-butylamine, phenethylamine, and ethylenediamine.

The thickness of the photoelectric conversion layer 3 may be set in accordance with the magnitude of light absorption thereof, and the thickness may be greater than or equal to 100 nm and less than or equal to 2,000 nm.

The photoelectric conversion layer 3 can be formed by using a solution containing the raw material and by using a coating method, a co-vapor deposition method, or the like.

The photoelectric conversion layer 3 may take on a form of a mixture with a portion of the hole transport layer 6 or the electron transport layer 5, described later, or a form in which there is a large-area interface in the film.

As described above, the photoelectric conversion layer 3 may have, on a face opposite the second electrode 4, a surface region 31 containing the first compound and the second compound. That is, the first compound and the second compound may be present in a surface-3a-side region, the surface 3a of the photoelectric conversion layer 3 being opposite the second electrode 4. The depth of the surface region 31 may be greater than or equal to 1 nm and less than or equal to 10 nm from the surface 3a. The photoelectric conversion layer 3 having such a configuration can be formed by, for example, a coating method or a printing method. Examples of the coating method include a doctor blade method, a bar coating method, a spraying method, a dip coating method, or a spin coating method. An example of the printing method is a screen printing method. For example, the photoelectric conversion layer 3 including the above-described surface region 31 can be formed by forming a precursor of a photoelectric conversion layer containing a perovskite compound containing a first metal element and a second metal element and, thereafter, coating the surface of the precursor of the photoelectric conversion layer with a solution containing an amine material by using a known technique so as to modify the surface.

Electron Transport Layer 5

The electron transport layer 5 contains a semiconductor. It is desirable that the electron transport layer 5 is formed of a semiconductor having a band gap of greater than or equal to 3.0 eV. Accordingly, visible light and infrared light can be passed to the photoelectric conversion layer 3. Examples of the semiconductor include organic n-type semiconductors and inorganic n-type semiconductors.

Examples of the organic n-type semiconductor include imide compounds, quinone compounds, fullerene, and derivatives of the fullerene. Examples of the inorganic n-type semiconductor include metal oxides and perovskite oxides. Examples of the metal oxide include oxides of Cd, Zn, In, Pb, Mo, W, Sb, Bi, Cu, Hg, Ti, Ag, Mn, Fe, V, Zr, Sr, Ga, Si, or Cr. Examples of the metal oxide include $TiO_2$ and $SnO_2$. Examples of the perovskite oxide include $SrTiO_3$ and $CaTiO_3$.

The electron transport layer 5 may contain a material having a band gap of greater than 6 eV. Examples of the material having a band gap of greater than 6 eV include (i) halides of alkali metals or alkaline-earth metals, such as lithium fluoride and calcium fluoride, (ii) oxides of alkaline-earth metals, such as magnesium oxide, and (iii) silicon dioxide.

In such an instance, to ensure the electron transportability, the electron transport layer 5 may have a thickness of, for example, less than or equal to 10 nm.

The electron transport layer 5 may contain a plurality of layers composed of materials that differ from each other.

Hole Transport Layer 6

The hole transport layer 6 contains a hole transport material. The hole transport material is a material for transporting holes.

The hole transport material is, for example, an organic semiconductor or a semiconductor.

An example of the organic semiconductor may be a phenyl amine containing a tertiary amine in the skeleton, a triphenylamine derivative, or PEDOT:PSS. There is no particular limitation regarding the molecular weight of the organic semiconductor, and the organic semiconductor may be a high polymer.

An example of the inorganic semiconductor is a p-type semiconductor. An example of the p-type semiconductor is $CuO$, $Cu_2O$, $CuSCN$, or $NiO$.

The thickness of the hole transport layer 6 may be greater than or equal to 1 nm and less than or equal to 1,000 nm and may be greater than or equal to 10 nm and less than or equal to 50 nm. The thickness being within the above-described range enables sufficient hole transportability to be realized. Since low resistance can be maintained, photovoltaic power generation can be performed with high efficiency.

Examples of the method for forming the hole transport layer 6 include a coating methods and printing methods. Examples of the coating method include a doctor blade method, a bar coating method, a spraying method, a dip coating method, and a spin coating method. Examples of the printing method include a screen printing method.

The hole transport layer 6 may contain a support electrolyte and a solvent. The support electrolyte and the solvent have an effect of stabilizing holes in the hole transport layer 6.

Examples of the support electrolyte include ammonium salts and alkali metal salts. Examples of the ammonium salt include tetrabutylammonium perchlorate, tetraethylammonium hexafluorophosphate, imidazolium salts, and pyridinium salts. Examples of the alkali metal salt include lithium perchlorate and potassium tetrafluoroborate.

The solvent contained in the hole transport layer 6 may have high ionic conductivity. The solvent may be either an aqueous solvent or an organic solvent. To stabilize the solute, the solvent may be an organic solvent. Examples of the organic solvent include heterocyclic compounds, such as tert-butyl pyridine, pyridine, and n-methylpyrrolidone.

Regarding the solvent, an ionic liquid may be used alone or in combination with other solvents. The ionic liquid has low volatility and high flame retardancy.

Examples of the ionic liquid include imidazolium compounds such as 1-ethyl-3-methylimidazolium tetracyanoborate, pyridine compounds, alicyclic amine compounds, aliphatic amine compounds, and azoniumamine compounds.

Example of Method for Producing Solar Cell

The solar cell according to the present embodiment may be produced by, for example, the following producing method.

The producing method according to the present embodiment includes, for example, (A) forming a precursor of a photoelectric conversion layer containing the perovskite compound containing the first metal element and the second metal element, and (B) forming a photoelectric conversion layer by coating the precursor of the photoelectric conversion layer with a solution containing an amine material having two or more carbon atoms so as to form a compound containing the first metal element or the second metal element and the amine material.

Herein, an example of the producing method will be described with reference to a solar cell 200 that is a second configuration example according to the present embodiment.

The solar cell 300 is obtained by forming the first electrode 2, the hole transport layer 6, the photoelectric conversion layer 3, the electron transport layer 5, and the second electrode 4 on the substrate 1 by using a coating method, such as spin coating, spray coating, die coating, ink jet, gravure coating, or flexographic coating, a physical vapor deposition method (PVD), such as vapor deposition or sputtering, or a chemical vapor deposition method (CVD) using heat, light, plasma, or the like. The photoelectric conversion layer 3 can be produced by a method including, for example, (A) and (B) described above.

EXAMPLES

The present disclosure will be described below in more detail with reference to the examples.

Example 1

A method for producing a solar cell according to Example 1 will be described below.

Initially, a glass substrate having a thickness of 0.7 mm was prepared.

A tin-doped indium oxide layer having a thickness of 150 nm was formed on the substrate by using a sputtering method. Consequently, a first electrode was formed.

Thereafter, a PEDOT:PSS dispersion liquid (produced by Heraeus) was applied to the first electrode by using a spin coating method. Consequently, a hole transport layer was formed.

Subsequently, the hole transport layer was coated with a raw material solution for forming a photoelectric conversion layer by using a spin coating method. The raw material solution was a mixture of $PbI_2$ (0.58 mol/L, produced by TOKYO KASEI KOGYO CO., LTD.), $SnI_2$ (0.87 mol/L, produced by Sigma-Aldrich), $SnF_2$ (0.087 mol/L, produced by Sigma-Aldrich), formamidinium iodide (0.58 mol/L, produced by GreatCell Solar) (hereafter referred to as "FAI"), methylammonium iodide (0.87 mol/L, produced by GreatCell Solar) (hereafter referred to as "MAI"), dimethylsulfoxide (DMSO, produced by FUJIFILM Wako Pure Chemical Corporation), and N,N-dimethylformamide (DMF, produced by FUJIFILM Wako Pure Chemical Corporation). The mixing ratio of DMSO to DMF in the raw material solution was 1:4 on a volume ratio basis. Consequently, a precursor of the photoelectric conversion layer was obtained.

Next, the precursor of the photoelectric conversion layer was coated with a solution containing an amine material having two or more carbon atoms. Consequently, a first compound of a first metal element and the amine material and a second compound of a second metal element and the amine material were formed in the interior of the photoelectric conversion layer. The solution containing the amine material was a mixture of ethylenediamine (0.1 mmol/L, produced by Sigma-Aldrich) and toluene (produced by FUJIFILM Wako Pure Chemical Corporation).

Thereafter, a fullerene film having a thickness of 25 nm and a bathocuproin (BCP) film having a thickness of 5 nm were continuously formed on the photoelectric conversion layer by using a vapor deposition method. In this manner, the electron transport layer was formed.

Subsequently, a silver film having a thickness of 100 nm was formed on the electron transport layer by using a vapor deposition method. In this manner, a second electrode was obtained.

Consequently, a solar cell according to Example 1 was obtained.

Example 2

In Example 2, the solution containing an amine material having two or more carbon atoms was a mixture of phenethylammonium iodide (0.1 g/L, produced by TOKYO KASEI KOGYO CO., LTD.) and 2-propanol (produced by FUJIFILM Wako Pure Chemical Corporation). A solar cell according to Example 2 was obtained in the manner akin to that of Example 1 except for the above.

Comparative Example 1

In Comparative example 1, the step of coating the photoelectric conversion layer with the solution containing an amine material having two or more carbon atoms was not performed. A solar cell according to Comparative example 1 was obtained in the manner akin to that of Example 1 except for the above.

Evaluation of Solar Cell Characteristics

The conversion efficiencies of the top cells in the solar cells according to Example 1, Comparative example 1, and Comparative example 2 were measured. A solar simulator (produced by Bunkoukeiki Co., Ltd.) and an electrochemical analyzer ALS (produced by BAS Inc.) were used for measuring the conversion efficiency. The quasi-solar light (illumination intensity of 100 $mW/cm^2$) which was reproduced so as to have a spectrum closely analogous to the solar light was applied to the cell. The top cell irradiated with the quasi-solar light was subjected to the measurement of the output current value while the applied voltage was changed by using the electrochemical analyzer so that the current-voltage characteristics (hereafter referred to as I-V characteristics) of the solar cell were measured. The conversion efficiency was calculated from an open-circuit voltage, a short-circuit current, and a fill factor of the resulting I-V characteristics.

Figure 3:
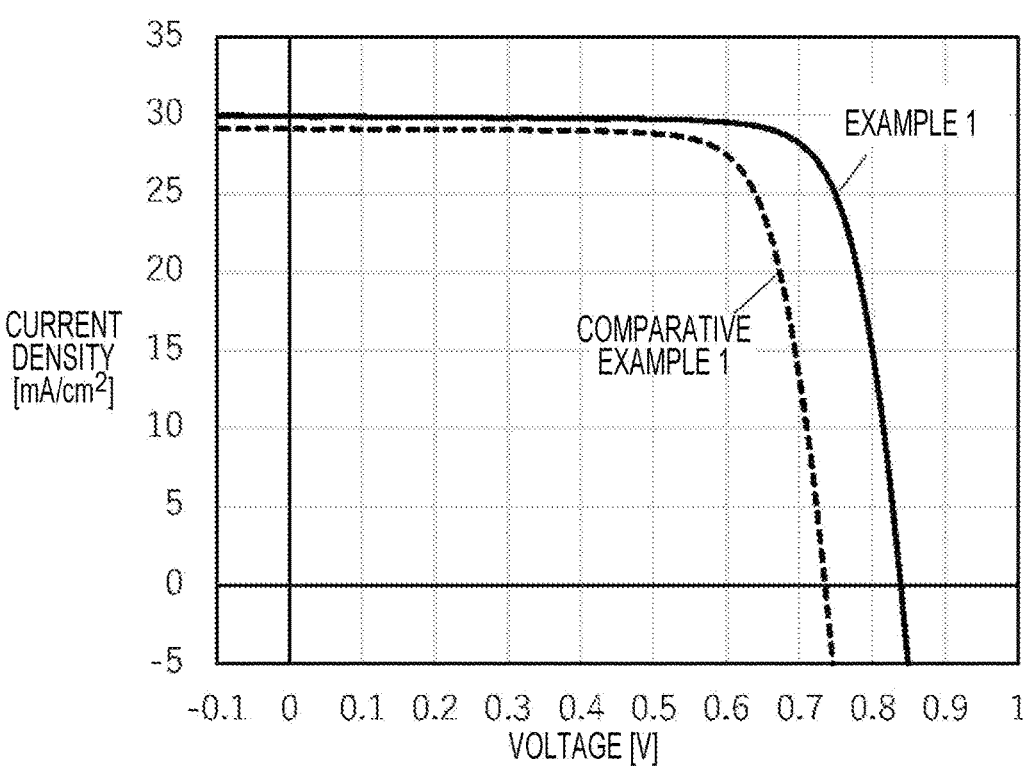
FIG. 3 is a graph illustrating the current-voltage characteristics of solar cells according to Example 1 and Comparative example 1.

FIG. 3 is a graph illustrating the I-V characteristics of the solar cells according to Example 1 and Comparative example 1. The horizontal axis in FIG. 3 represents the applied voltage, and the vertical axis represents the current density.

As illustrated in FIG. 3, it can be ascertained that the solar cell according to Example 1 had a higher open-circuit voltage than the solar cell according to Comparative example 1. In such an instance, the conversion efficiencies of the solar cells according to Example 1 and Comparative example 1 were 19.74% and 16.49%, respectively. Therefore, it can be ascertained that the conversion efficiency was improved due to the configuration of the solar cell according to Example 1.

Next, four solar cells of each of Example 1, Example 2, and Comparative example 1 were produced, and the open-circuit voltage when the quasi-solar light was applied was measured.

Figure 4:
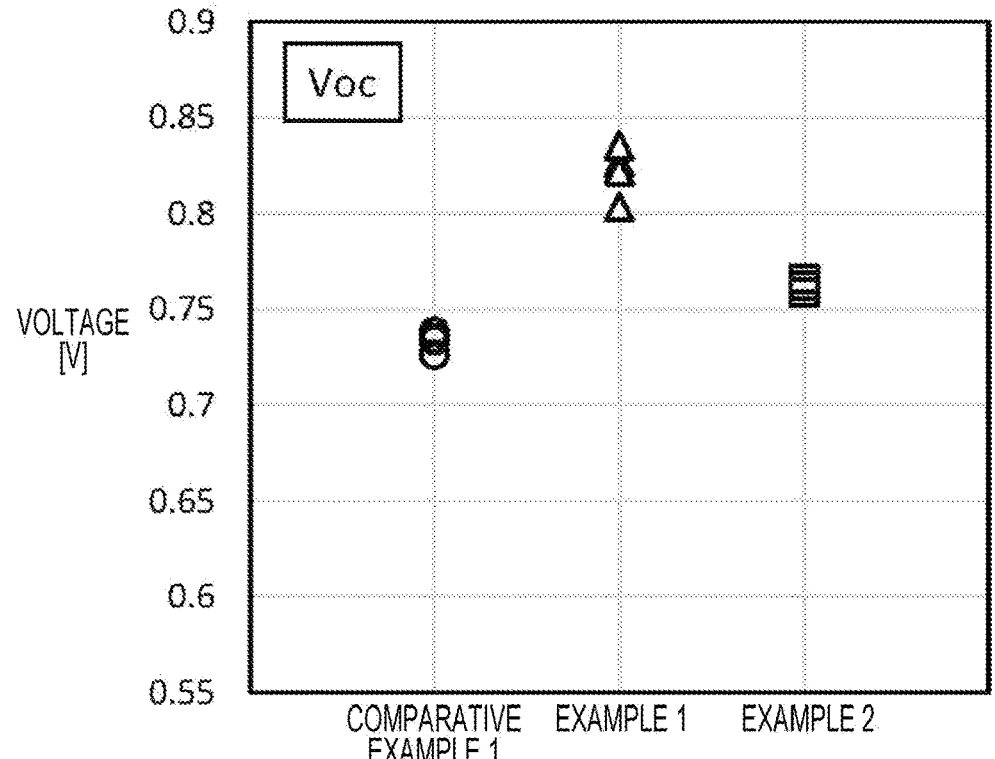
FIG. 4 is a graph illustrating plots of open-circuit voltages of solar cells according to Example 1, Example 2, and Comparative example 1.

FIG. 4 is a graph illustrating plots of open-circuit voltages of solar cells according to Example 1, Example 2, and Comparative example 1.

As illustrated in FIG. 4, it can be ascertained that the solar cells according to Example 1 and Example 2 had a higher open-circuit voltage than the solar cell according to Comparative example 1.

Subsequently, the photoelectric conversion layers constituting the solar cells according to Example 1 and Comparative example 1 were subjected to X-ray diffraction measurement. An automated multipurpose X-ray diffractometer SmartLab (produced by Rigaku Corporation) was used for measuring the X-ray diffraction. The diffraction intensity was measured by applying X-ray to the photoelectric conversion layer while the incident angle and the outgoing angle were changed from 10 degrees to 16 degrees.

Figure 5:
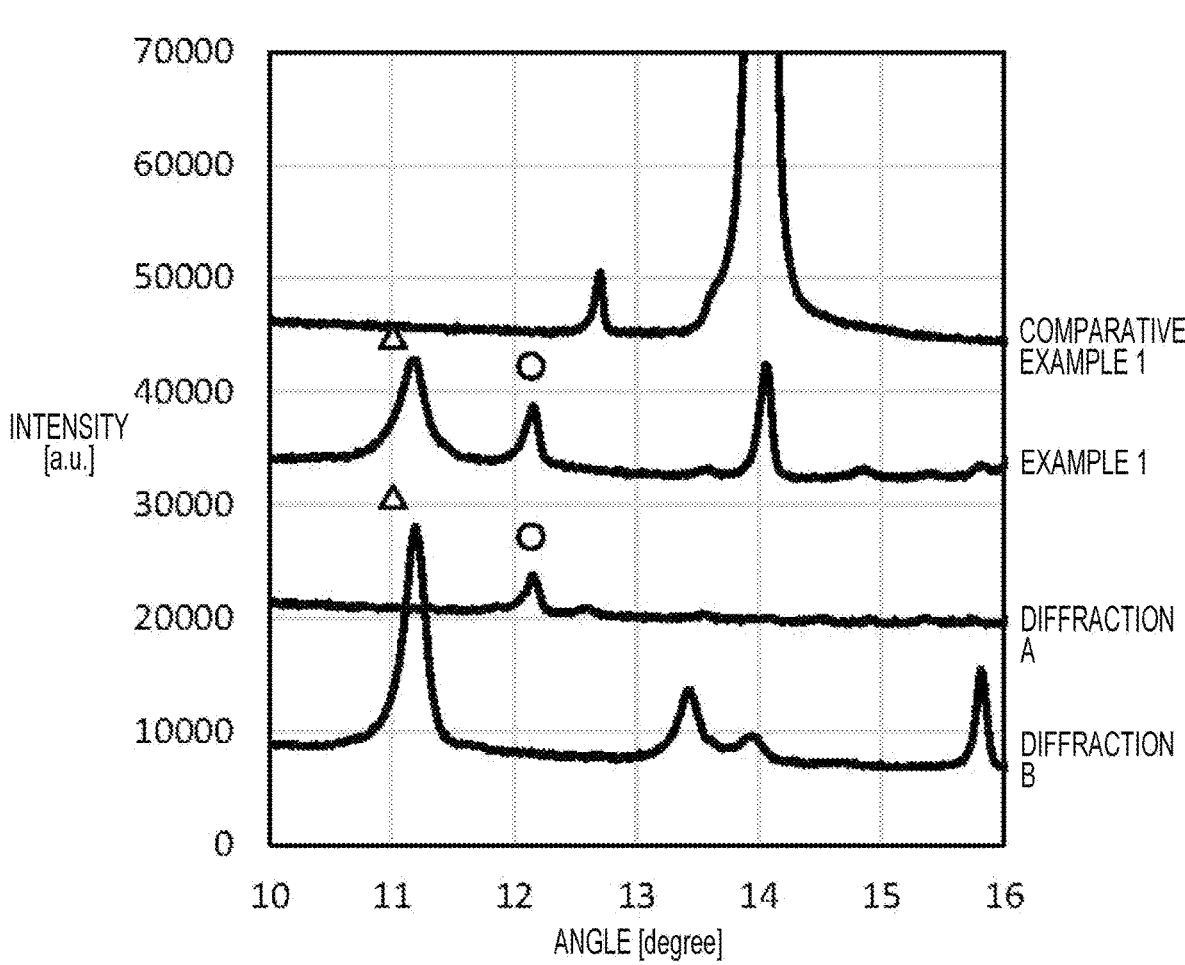
FIG. 5 is a graph illustrating X-ray diffraction patterns of photoelectric conversion layers constituting the solar cells according to Example 1 and Comparative example 1.

FIG. 5 is a graph illustrating X-ray diffraction patterns of photoelectric conversion layers constituting the solar cells according to Example 1 and Comparative example 1. The horizontal axis in FIG. 5 represents the incident angle and the outgoing angle of the X-ray, and the vertical axis represents the diffraction intensity.

As illustrated in FIG. 5, regarding Example 1 and Comparative example 1, peaks were observed at 14.1 degrees. Further, regarding Example 1, two peaks were observed at 11.2 degrees and 12.2 degrees on the low angle side.

The data presented as Diffraction A in FIG. 5 illustrate the X-ray diffraction intensity of a compound in which the solution containing the amine material in Example 1 was applied to a perovskite compound containing only tin at the B site. In addition, the data presented as Diffraction B illustrate the X-ray diffraction intensity of a compound in which the solution containing the amine material in Example 1 was applied to a perovskite compound containing only lead at the B site.

In FIG. 5, when Example 1 is compared with Diffraction A and Diffraction B, it can be ascertained that the peak at 12.2 degrees is in accord with Diffraction A, and the peak at 11.2 degrees is in accord with Diffraction B.

Therefore, it can be ascertained that the photoelectric conversion layer constituting the solar cell according to Example 1 contained the perovskite material in which tin and lead were included at the B site according to Comparative example 1 and, in addition, both the compound exhibiting Diffraction A and containing tin and the amine material and the compound exhibiting Diffraction B and containing lead and the amine material.

The solar cell according to the present disclosure can be used for various applications including solar cell applications in the related art.

What is claimed is:

1. A solar cell comprising:
a first electrode, a photoelectric conversion layer, and a second electrode in this order,
wherein the photoelectric conversion layer comprises
a perovskite compound comprising a first metal element and a second metal element different from the first metal element, a first compound consisting of the first metal element and a first amine material having two or more carbon atoms, and
a second compound consisting of the second metal element and a second amine material having two or more carbon atoms.

2. The solar cell according to claim 1,
wherein the photoelectric conversion layer has, on a face opposite the second electrode, a surface region containing the first compound and the second compound.

3. The solar cell according to claim 1, further comprising an electron transport layer,
wherein the electron transport layer is disposed between the photoelectric conversion layer and the second electrode.

4. The solar cell according to claim 1,
wherein the first metal element is lead, and
the second metal element is tin.

5. The solar cell according to claim 1, wherein
the first amine material is ethylenediamine, and
the second amine material is ethylenediamine.

6. The solar cell according to claim 1, wherein
the first metal element is a divalent metal element, and
the second metal element is a divalent metal element.

7. The solar cell according to claim 1, wherein
the first amine material is at least one selected from the group consisting of n-butylamine, phenethylamine, and ethylenediamine, and
the second amine material is at least one selected from the group consisting of n-butylamine, phenethylamine, and ethylenediamine.

8. A method for producing a solar cell, comprising:
(A) forming a precursor of a photoelectric conversion layer containing a perovskite compound containing a first metal element and a second metal element different from the first metal element, and
(B) forming a photoelectric conversion layer by coating the precursor of the photoelectric conversion layer with a solution containing an amine material having two or more carbon atoms so as to form a compound consisting of:
the first metal element and the amine material, or
the second metal element and the amine material.

9. The method according to claim 8, wherein
the amine material is at least one selected from the group consisting of n-butylamine, phenethylamine, and ethylenediamine.

* * * * *